United States Patent [19]

Greenwood et al.

[11] Patent Number: 5,444,303

[45] Date of Patent: Aug. 22, 1995

[54] WIRE BOND PAD ARRANGEMENT HAVING IMPROVED PAD DENSITY

[75] Inventors: Jonathon Greenwood, Boynton Beach; Douglas W. Hendricks, Boca Raton; Frank Juskey, Coral Springs, all of Fla.

[73] Assignee: Motorola, Inc., Schaumburg, Ill.

[21] Appl. No.: 288,384

[22] Filed: Aug. 10, 1994

[51] Int. Cl.$^6$ ............... H01L 29/44; H01L 23/48; H01L 29/60

[52] U.S. Cl. ............... 257/786; 257/666; 257/773; 257/784

[58] Field of Search ............... 257/786, 784, 774, 773, 257/775, 776, 666, 668

[56] References Cited

U.S. PATENT DOCUMENTS

| | | | |
|---|---|---|---|
| 5,134,462 | 7/1992 | Freyman et al. | 357/74 |
| 5,168,368 | 12/1992 | Gow, 3rd et al. | 257/666 |
| 5,229,638 | 7/1993 | Ito | 257/773 |
| 5,241,133 | 8/1993 | Mullen, III et al. | 257/787 |
| 5,293,066 | 3/1994 | Tsumura | 257/668 |
| 5,293,067 | 3/1994 | Thompson et al. | 257/668 |
| 5,300,815 | 4/1994 | Rostoker | 257/786 |
| 5,399,904 | 3/1995 | Kozono | 257/666 |

*Primary Examiner*—Robert P. Limanek
*Assistant Examiner*—Alexander Oscar Williams
*Attorney, Agent, or Firm*—R. Louis Breeden

[57] ABSTRACT

A wire bond pad arrangement (104) has an improved pad density for providing a plurality of wire bond terminations for interconnection with corresponding terminations (604) of an IC chip (302). The wire bond pad arrangement (104) includes a substrate (102) and a plurality of pads (912) disposed on the substrate (102) adjacent to one another to form a row of pads (912). Each of the pads (912) is formed in a trapezoidal shape having short and long sides parallel to one another and substantially perpendicular to a line from a central point of the pad (912) to a central point of the corresponding termination (604) of the IC chip (302). The long sides of adjacent pads (912) are positioned alternately towards and away from the corresponding terminations (604) of the IC chip 302).

9 Claims, 5 Drawing Sheets

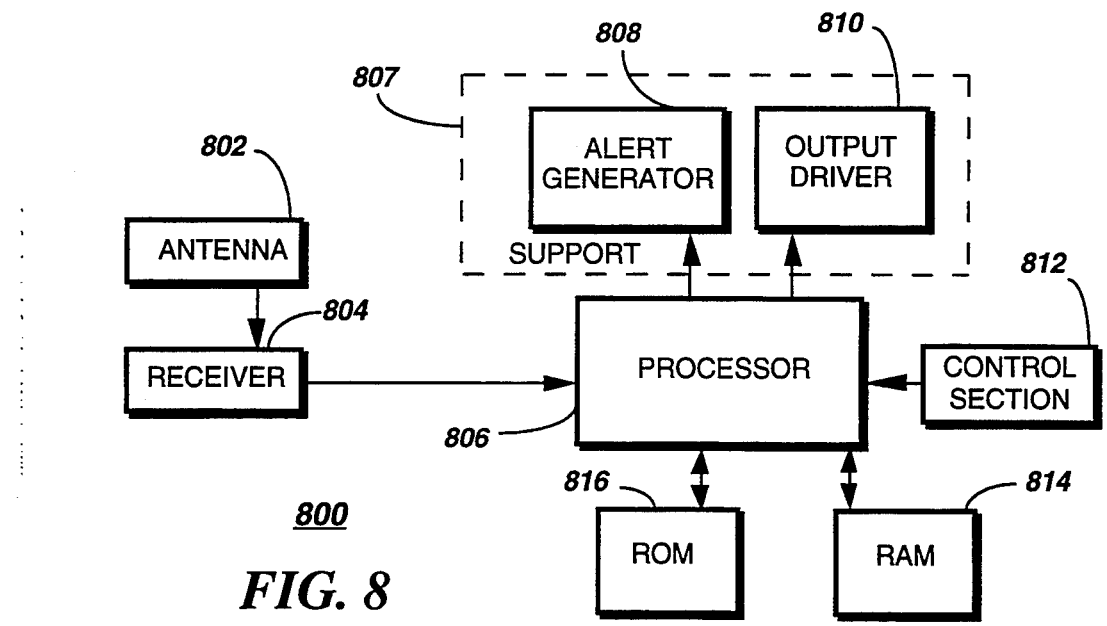
FIG. 8
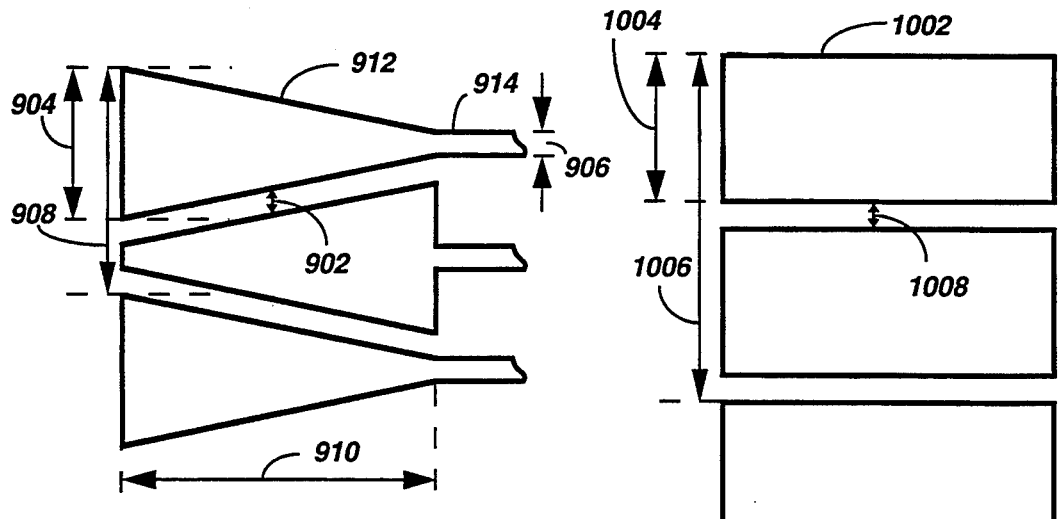
FIG. 9
FIG. 10 PRIOR ART

WIRE BOND PAD ARRANGEMENT HAVING IMPROVED PAD DENSITY

FIELD OF THE INVENTION

This invention relates in general to wire bond pad arrangements for interconnecting integrated circuit chips, and more specifically to a wire bond pad arrangement having improved pad density for reducing wire bond sweep near the corners of the integrated circuit chip,

BACKGROUND OF THE INVENTION

Wire bonding is a well-known method of interconnecting the terminations of an integrated circuit (IC) chip to corresponding pads of a chip carrier or circuit bearing substrate. Conventional wire bond pad arrangements have utilized rectangular pads for receiving the wire bond interconnections from the IC chip. IC chips that require a large amount of input and output interconnections typically are fabricated with terminations having a very fine center-to-center pitch, e.g., seven mils (0.1778 mm).

The very fine pitch of the IC terminations in combination with the minimum pad width and pad separation of the rectangular wire bond pads required for acceptable wire bond manufacturing yields can cause an overly wide sweep of the wire bonds near the corners of the chip. The overly wide sweep causes the angle between the wire bond and the edge of the chip to be less than the minimum angle considered acceptable, e.g., forty-five degrees. Wire bond angles below the minimum acceptable angle are accompanied by a sharp increase in defects due to shorted and/or broken wire bonds.

Thus, what is needed is a wire bond pad arrangement that reduces wire bond sweep near the corners of the IC chip without violating the minimum pad width and pad separation requirements for acceptable wire bond manufacturing yields.

SUMMARY OF THE INVENTION

One aspect of the present invention is a wire bond pad arrangement having an improved pad density for providing a plurality of wire bond terminations for interconnection with corresponding terminations of an integrated circuit (IC) chip. The wire bond pad arrangement comprises a substrate and a plurality of pads disposed on the substrate adjacent to one another to form a row of pads. Each of the pads is formed in a trapezoidal shape having short and long sides parallel to one another and substantially perpendicular to a line from a central point of the pad to a central point of the corresponding termination of the IC chip. The long sides of adjacent pads are positioned alternately towards and away from the corresponding terminations of the IC chip.

Another aspect of the present invention is an integrated circuit (IC) chip carrier comprising a wire bond pad arrangement having an improved pad density for providing a plurality of wire bond terminations for interconnection with corresponding terminations of an IC chip. The wire bond pad arrangement comprises a substrate and a plurality of pads disposed on the substrate adjacent to one another to form a row of pads. Each of the pads is formed in a trapezoidal shape having short and long sides parallel to one another and substantially perpendicular to a line from a central point of the pad to a central point of the corresponding termination of the IC chip. The long sides of adjacent pads are positioned alternately towards and away from the corresponding terminations of the IC chip. The IC chip carrier further comprises a mounting pad array disposed on the bottom surface of the IC chip carrier and having an interconnection with the plurality of pads.

Another aspect of the present invention is a communication receiver comprising an antenna for intercepting a signal including information, and a receiver element coupled to the antenna for demodulating the signal to derive the information. The communication receiver further comprises a processor coupled to the receiver for processing the information, and a support circuit coupled to the processor for providing miscellaneous support functions. The communication receiver also includes a circuit bearing substrate coupled to the antenna, the receiver element, the processor, and the support circuit for interconnecting the same, and an integrated circuit (IC) chip carrier attached to at least one of the receiver element, the processor, and the support circuit for carrying and interconnecting the same. The IC chip carrier comprises a wire bond pad arrangement having an improved pad density for providing a plurality of wire bond terminations for interconnection with corresponding terminations of the at least one of the receiver element, the processor, and the support circuit. The wire bond pad arrangement comprises a substrate and a plurality of pads disposed on the substrate adjacent to one another to form a row of pads. Each of the pads is formed in a trapezoidal shape having short and long sides parallel to one another and substantially perpendicular to a line from a central point of the pad to a central point of the corresponding termination of the at least one of the receiver element, the processor, and the support circuit. The long sides of adjacent pads are positioned alternately towards and away from the corresponding terminations of the at least one of the receiver element, the processor, and the support circuit. The IC chip carrier further comprises a mounting pad array disposed on the bottom surface of the IC chip carrier and having an interconnection with the plurality of pads. The mounting pad array is also coupled to the circuit bearing substrate for interconnecting therewith.

BRIEF DESCRIPTION OF THE DRAWINGS

FIG. 8 is an electrical block diagram of the communication receiver in accordance with the preferred embodiment of the present invention.

FIG. 9 is an orthogonal top view of a portion of the wire bond pad arrangement in accordance with the preferred embodiment of the present invention.

FIG. 10 an orthogonal top view of a corresponding portion of a prior art wire bond pad arrangement.

DESCRIPTION OF THE PREFERRED EMBODIMENT

Figure 1:
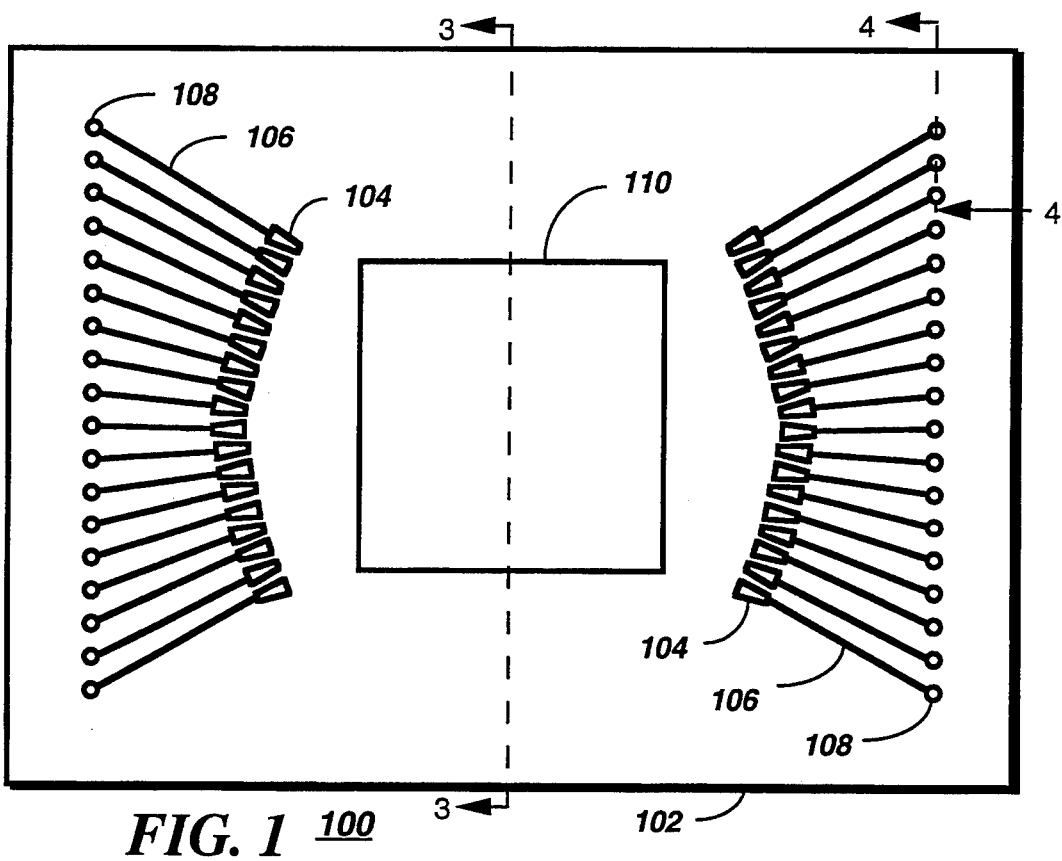
FIG. 1 is an orthogonal top view of an integrated circuit chip carrier (depicted with chip and encapsulant removed) having a wire bond pad arrangement in accordance with the preferred embodiment of the present invention.

A wire bond connection between a termination on an IC chip and a corresponding pad on a chip carrier or circuit bearing substrate preferably utilizes two different types of bonds. At the chip termination end, the preferred bond is a "ball" bond. The ball bond can be made only as the first bond of each wire bond, i.e., when the wire is not attached to anything else, and is made with the wire substantially perpendicular to the termination surface. Because of the way in which the ball bond is made, the ball bond requires only a very small target termination, e.g., a four mil (0.1016 mm) square termination for acceptable manufacturing yield. This allows the chip terminations to be placed with a very fine center-to-center pitch, e.g., seven mils (0.1778 mm).

At the chip carrier or circuit bearing substrate pad end of the wire bond, the wire is preferably fed continuously from the wire bonding machine as the machine moves from the ball bond on the chip termination to the chip carrier pad. The type of bond that is made to the chip carrier or circuit bearing substrate pad is preferably a "wedge" bond, in which the wire is substantially parallel to the surface of the pad and is "smeared" onto the pad. Following the attachment to the chip carrier or circuit bearing substrate pad, the wire is cut, thereby readying the wire bonding machine for the next wire bond.

The wedge bond requires a substantially larger pad, e.g., eight mils (0.2032 mm) wide by twelve mils (0.3048 mm) long, for acceptable manufacturing yield, compared to the chip termination size required for the ball bond. In addition to the minimum width required for the pad, there is a minimum spacing required between pads. The minimum spacing varies, e.g., from 1 to 3 mils (0.0254 to 0.0762 mm), depending on the type of substrate on which the pad is formed. The minimum required pad width and pad spacing for the chip carrier or circuit bearing substrate pads in combination with the very fine pitch of the chip terminations produce an undesirable overly wide sweep of the wire bonds near the corners of the chip, as discussed above in the Background of the Invention.

In endeavoring to find a way to reduce the overly wide sweep of the wire bonds, the inventors have discovered that a novel trapezoidal pad having a first width at one end equal to the minimum width allowable for the conventional rectangular pad, and a second width at the opposite end equal to the minimum runner width possible for the substrate produces satisfactory manufacturing yields if the length of the pad is about twice the first width. For example, if the chip carrier utilizes a flexible substrate as described more fully below, the runner width and pad spacing can be 1mil (0.0254 mm) each. The chip carrier pad in accordance with the preferred embodiment of the present invention would have a first width of eight mils (0.2032 mm), a second width of 1 mil (0.0254 mm), and a length of sixteen mils (0.4064 mm). By arranging the trapezoidal pads such that adjacent pads face in opposite directions, it becomes possible to reduce the wire bond sweep, as will be described more fully herein below.

Referring to FIG. 1, an orthogonal top view of an integrated circuit chip carrier 100 (depicted with chip and encapsulant removed) having a wire bond pad arrangement 104 in accordance with the preferred embodiment of the present invention preferably comprises a flexible substrate 102. Disposed on the top surface of the flexible substrate 102 are the wire bond pad arrangement 104 for interconnection with at least one integrated circuit chip, which is to be attached to the integrated circuit chip carrier 100 over a ground plane 110. The individual pads of the wire bond pad arrangement 104 are trapezoidal in shape and preferably are arranged in arcuate rows in which the wide and narrow ends of adjacent pads alternate, thereby allowing a greater density of pads than would be possible with conventional rectangular pads. A plurality of "vias" 108 are interconnected with the wire bond pad arrangement 104 by a plurality of runners 106. The plurality of "vias" 108 are for interconnecting the at leas one integrated circuit chip with a mounting pad array disposed on the bottom surface of the flexible substrate 102, as will be described herein below.

An advantage provided by the utilization of the flexible substrate 102 is the ability to achieve a much higher density of the runners 106 and "vias" 108, as compared to conventional rigid circuit technology. The higher density of the runners 106 and "vias" 108 advantageously contributes to size reduction of the IC chip carrier 100.

The material utilized for the flexible substrate 102 is preferably a polyimide such as DuPont Kapton ™. The thickness of the flexible substrate 102 is preferably five mils (0.127 mm). The ground plane 110, the wire bond pad arrangement 104, the plurality of "vias" 108, and the plurality of runners 106 preferably are conventional one mil (0.025.4 mm) thick copper, etched to provide the desired land areas, and then overplated with conventional thicknesses of nickel and gold. It will be appreciated that other similar materials and material thicknesses can be substituted without departing from the intent of the present invention.

While FIG. I (along with FIG. 6) depicts the IC chip carrier 100 as having two rows of the pads in the wire bond pad arrangement 104 on two opposite sides of the IC chip 302 for interconnecting therewith, it will be appreciated that, alternatively, the IC chip carrier 100 can comprise four rows of the pads in the wire bond pad arrangement 104 on all four sides of the IC chip 302 for interconnecting therewith, the exact arrangement being a matter of design choice and IC chip architecture.

Figure 2:
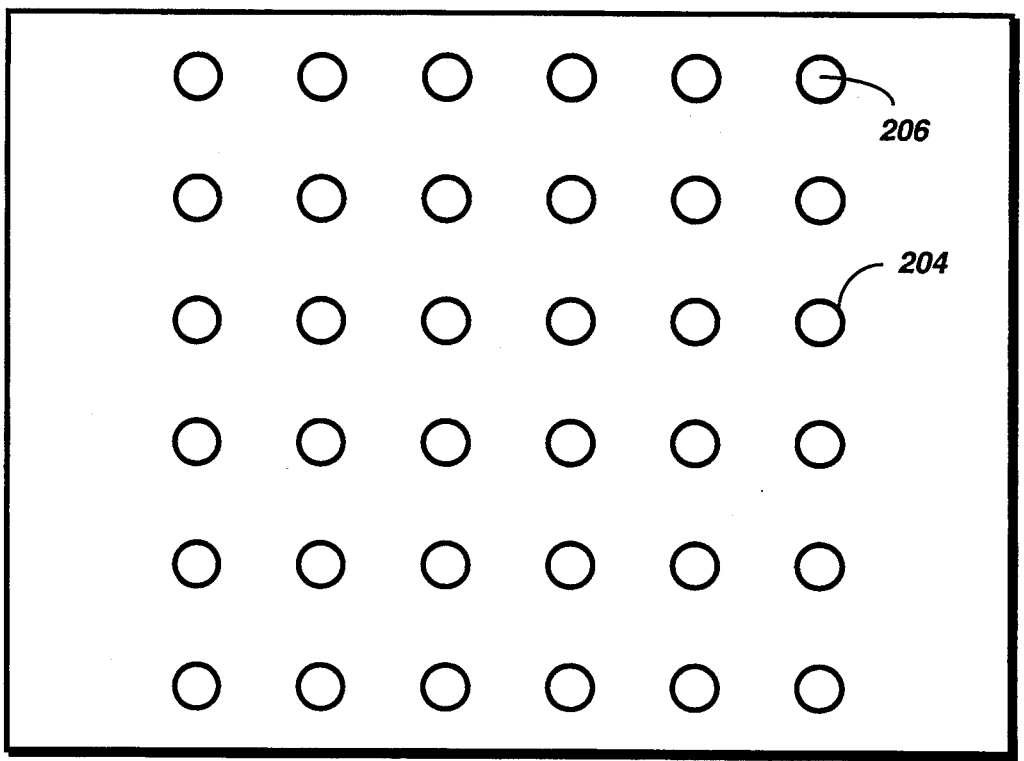
FIG. 2 is an orthogonal bottom view of the integrated circuit chip carrier in accordance with the preferred embodiment of the present invention.

Referring to FIG. 2, an orthogonal bottom view of the integrated circuit chip carrier 100 in accordance with the preferred embodiment of the present invention depicts a rigid substrate 202 having an array of holes 204 extending therethrough. Solder 206 extends through each of the array of holes 204 beyond the bottom surface of the rigid substrate 202. Preferably, the rigid substrate comprises a glass weave material impregnated with a high temperature FR-4 epoxy, the substrate having a finished thickness of ten mils (0.254 mm). Preferably, a punch is utilized to create the array of holes 204 through the rigid substrate 202, utilizing a pitch of 20 mils (0.508 mm). It will be appreciated that other similar materials, thicknesses, pitches, and tools can be used as well in fabricating the rigid substrate 202.

The array of holes 204 is punched such that each of the holes 204 aligns with a corresponding mounting pad 502 (FIG. 5) of an array of mounting pads 502 disposed on the bottom surface of the flexible substrate 102. An important advantage of the array of holes 204 during the manufacture of the IC chip carrier 100 is that the array of holes 204 can be used to facilitate placement of solder balls prior to a reflow process used to attach the solder balls to the array of mounting pads 502. By inverting the IC chip carrier 100 so that the array of holes 204 is facing upward, solder balls brushed onto the rigid substrate 202 are pushed into the holes 204, aided by gravity. Thus the array of holes 204 advantageously provides a positive locating fixture integral to the IC chip carrier 100 for more accurate solder ball placement. After a reflow heating process, the solder balls melt and attach to the array of mounting pads 502 as the solder 206 depicted in FIG. 2.

Figure 3:
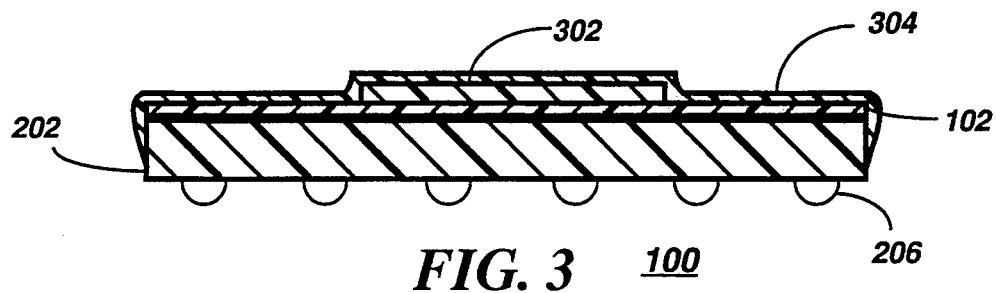
FIG. 3 is an orthogonal cross-section view (vertical dimension exaggerated) of the integrated circuit chip carrier depicting the chip and encapsulant in accordance with the preferred embodiment of the present invention.

Referring to FIG. 3, an orthogonal cross-section view taken along the line 3—3 of FIG. 1 (vertical dimension exaggerated) of the integrated circuit chip carrier 100 depicts the IC chip 302 and encapsulant 304 in accordance with the preferred embodiment of the present invention. Also shown in FIG. 3 is the flexible substrate 102, which is laminated to the rigid substrate 202. In addition, the solder 206 is depicted extending through the array of holes 204 beyond the bottom surface of the rigid substrate 202.

Figure 4:
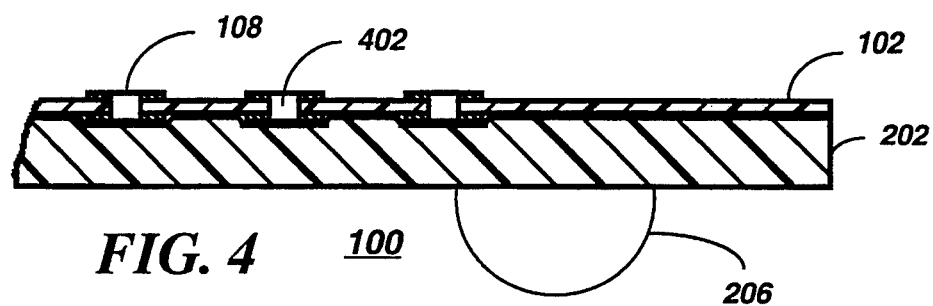
FIG. 4 is an orthogonal cross-section view (vertical dimension exaggerated) of a portion of the integrated circuit chip carrier depicting "vias" in accordance with the preferred embodiment of the present invention.

Referring to FIG. 4, an orthogonal cross-section view taken along the line 4—4 of FIG. 1 (vertical dimension exaggerated) of a portion of the integrated circuit chip carrier 100 depicts the "vias" 108 in accordance with the preferred embodiment of the present invention. The view of FIG. 4 also depicts an interconnection cylinder 402 plated through each "via" 108 for electrically interconnecting the IC chip 302 on the top surface of the flexible substrate 102 with the array of mounting pads 502 on the bottom surface of the flexible substrate 102.

Figure 5:
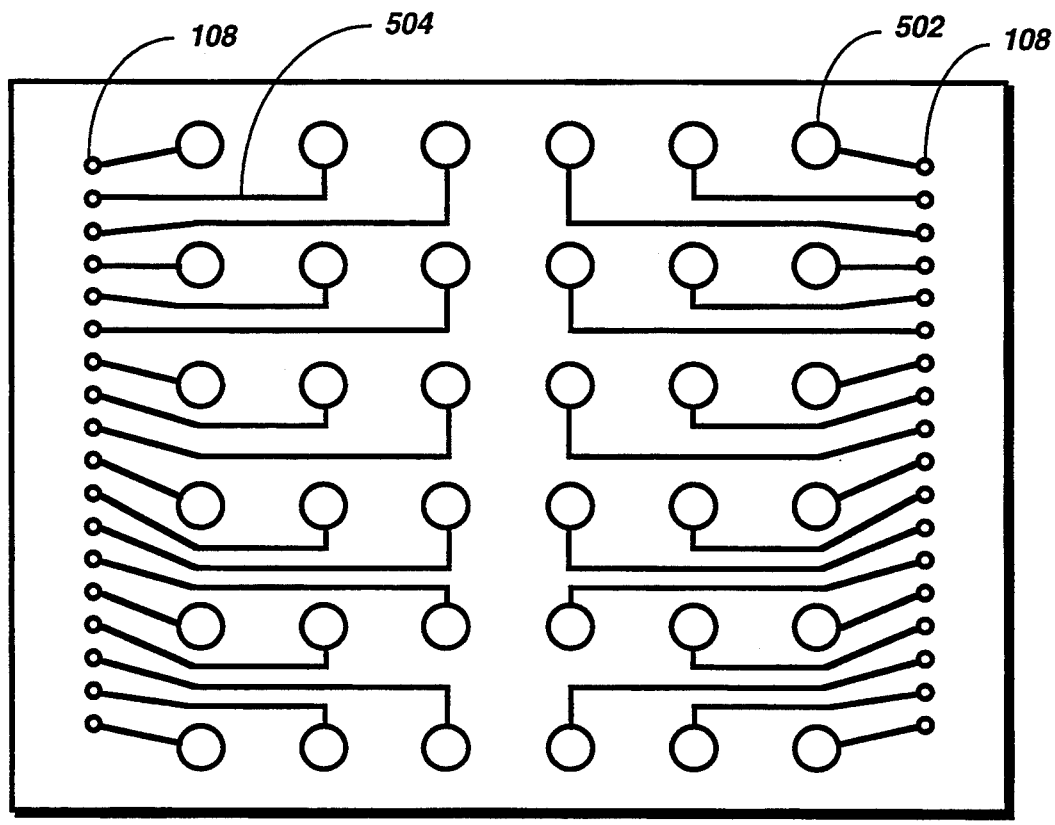
FIG. 5 is an orthogonal bottom view of a flexible substrate in accordance with the preferred embodiment of the present invention.

Referring to FIG. 5, an orthogonal bottom view of the flexible substrate 102 in accordance with the preferred embodiment of the present invention depicts runners 504 for interconnecting the "vias" 108 with the array of mounting pads 502. Because multiple ones of the runners 504 must pass between the individual pads 502 of the array of mounting pads 502, it is important that the line width and spacing of the runners 504 be minimized in order to achieve maximum density of the array of mounting pads 502. As described herein above, the flexible circuit technology utilized in the preferred embodiment of the present invention advantageously minimizes the line width and spacing to maximize the density of the mounting pads 502.

Figure 6:
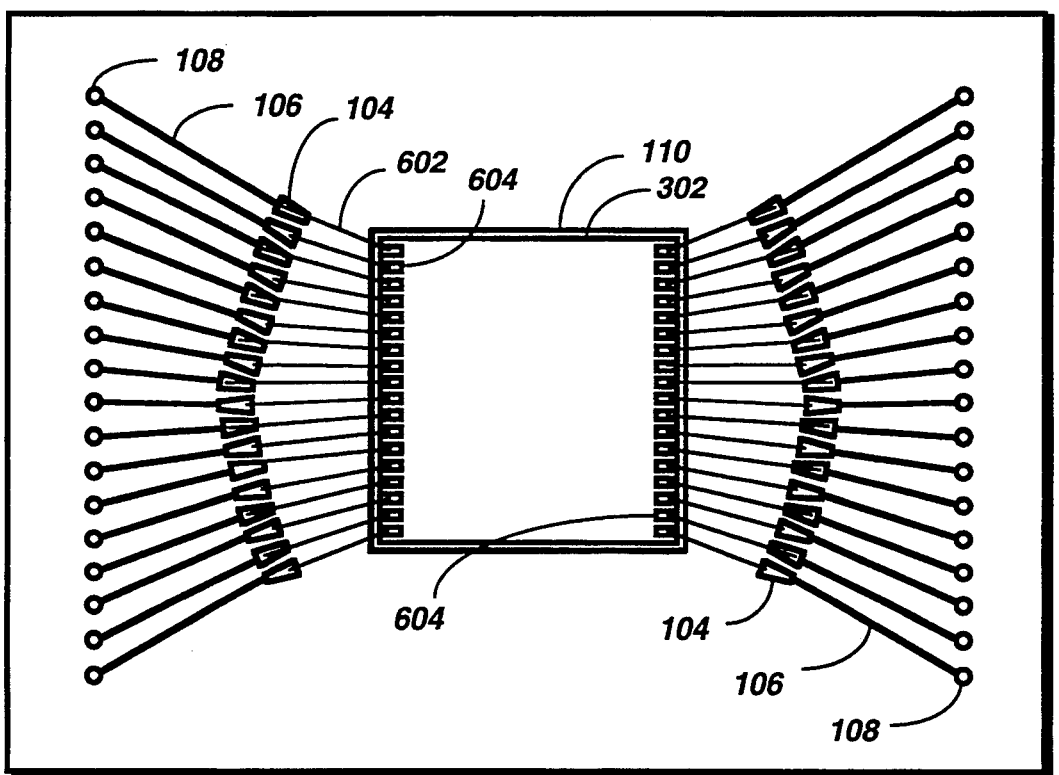
FIG. 6 is an orthogonal top view of the integrated circuit chip carrier (encapsulant removed) depicting the chip wire bonded to the wire bond pad arrangement on the flexible substrate in accordance with the preferred embodiment of the present invention.

Referring to FIG. 6, an orthogonal top view of the integrated circuit chip carrier 100 (encapsulant 304 removed) depicts the IC chip 302 wire bonded to the wire bond pad arrangement 104 of the flexible substrate 102 in accordance with the preferred embodiment of the present invention. Wire bonds 602 extend from a plurality of contact pads 604 of the IC chip 302 to the wire bond pad arrangement 104 on the flexible substrate 102 for interconnection therewith. It can be seen in FIG. 6 that each of the pads of the wire bond pad arrangement 104 is formed in a trapezoidal shape having short and long sides parallel to one another and substantially perpendicular to a line from a central point of the pad to a central point of the corresponding contact pad 604 of the IC chip 302.

It can further be seen that the long sides (as well as the short sides) of adjacent pads are positioned alternately towards and away from the corresponding contact pads 604 of the IC chip 302. In addition, the wire bonds 602 that are attached to the wire bond pad arrangement 104 are attached near the long side, i.e. in the widest portion, of each pad to maximize the reliability of the wire bond. Note also that the IC chip 302 is centered over the ground plane 110 after being mounted to the IC chip carrier 100.

Figure 7:
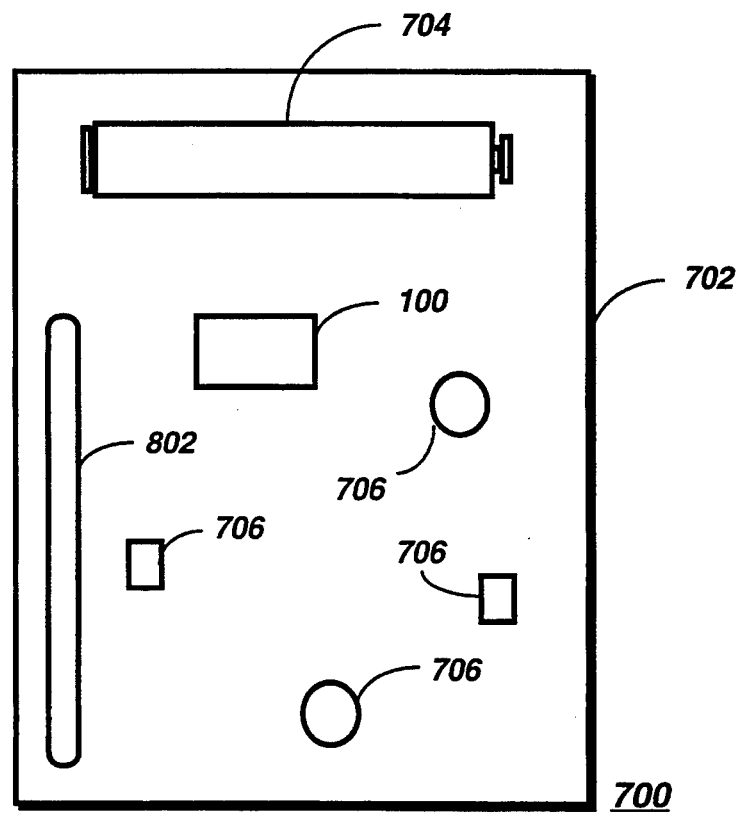
FIG. 7 is an orthogonal top view of a circuit bearing substrate of a communication receiver in accordance with the preferred embodiment of the present invention.

Referring to FIG. 7, an orthogonal top view of a circuit bearing substrate 700 of a communication receiver 800 (FIG. 8) in accordance with the preferred embodiment of the present invention depicts a printed wiring board 702. Mounted on the printed wiring board 702 are a battery 704 for providing power to the communication receiver 800, and the IC chip carrier 100 in accordance with the preferred embodiment of the present invention, comprising support circuitry 807 (FIG. 8). Also depicted are a conventional antenna 802 for intercepting communication signals, and other elements 706 forming the communication receiver 800, as will be further described in FIG. 8. It will be appreciated that in an alternative embodiment the IC chip carrier 100 can comprise a processor 806 (FIG. 8), a read-only memory (ROM) 816 (FIG. 8), a random access memory (RAM) 814 (FIG. 8), and a receiver element 804 (FIG. 8) in any combination, with or without the support circuitry 807, as well.

Referring to FIG. 8, an electrical block diagram of the communication receiver 800 in accordance with the preferred embodiment of the present invention depicts the antenna 802 for intercepting communication signals including information. The receiver element 804 is coupled to the antenna 802 for demodulating the communication signal to derive the information. The receiver element 804 is preferably similar to the receiver element of the model A03KLB5962CA ADVISOR®pager, manufactured by Motorola, Inc. of Schaumburg, IL. The processor 806 is coupled to the receiver element 804 for processing the information. Preferably, the processor 806 is similar to the MC68HC 05, C 08, or C 11 series microcomputer manufactured by Motorola, Inc. of Schaumburg, Ill. The support circuitry 807 comprises an alert generator 808 for generating an alert through, for example, a conventional piezoelectric transducer. The alert generator 808 is coupled to the processor 806 for generating the alert responsive to the information received. An output driver 810, for driving, for example, a well-known liquid crystal display or a speaker, is coupled to the processor 806 for visibly or audibly reproducing the information received. A control section 812, comprising well-known knobs, switches, and buttons, is coupled to the processor 806 for allowing a user to control the communication receiver 800. A conventional random access memory (RAM) 814 is coupled to the processor 806 for storing the information received. A conventional read-only memory (ROM) 816 is also coupled to the processor 806 for storing operating software and other necessary parameters.

It will be appreciated that other types of ROM, e.g., electrically erasable programmable ROM (EEPROM) and electrically alterable ROM (EAROM), can be utilized as well for the ROM 816, and further that the processor 806, the ROM 816, and the RAM 814 can be fabricated as a contiguous integrated circuit in an alternative embodiment in accordance with the present invention.

Referring to FIG. 9, an orthogonal top view of a portion of the wire bond pad arrangement 104 in accordance with the preferred embodiment of the present invention depicts in detail the trapezoidal shape of each pad 912. One end of the pad 912 has a first width 904 that is preferably equal to the minimum width required to perform a wedge type wire bond, e.g., eight mils (0.2032 mm). The opposite end of each pad 912 has a second width 906 that is preferably equal to the minimum width allowed for the runner 914, e.g., one mil (0.025 mm) for a flexible substrate. The spacing 902 between the pads 912 is preferably equal to the minimum spacing allowed for the substrate, e.g., one mil (0.025 mm) for a flexible substrate. The length 910 of the pad 912 is preferably about twice the first width 904, e.g., sixteen mils (0.4064 mm).

The orientation of adjacent ones of the pads 912 alternates from right to left, such that the end having the first width 904 is positioned alternately towards and away from the positions of the corresponding terminations 604 of the IC chip 302 (not shown in FIG. 9, but which positions are to the left of FIG. 9). When the pads 912 are arranged as shown in FIG. 9, the repetition width 908 for accommodating two of the pads 912 is substantially equal to the first width 904, plus the second width 906, plus two times the spacing 902. For the example widths and spacing given above, the repetition width 908 equals eight, plus one, plus two, or eleven mils (0.2794 mm).

Referring to FIG. 10, an orthogonal top view of a corresponding portion of a prior art wire bond pad arrangement 1000 depicts the rectangular shape of the conventional pad 1002. The pad has a width 1004 that is preferably equal to the minimum width required to perform a wedge type wire bond, e.g., eight mils (0.2032 mm). The spacing 1008 between the pads 1002 is preferably equal to the minimum spacing allowed for the substrate, e.g., one mil (0.025 mm) for a flexible substrate. When positioned as shown in FIG. 10, the repetition width 1006 for accommodating two of the pads 1002 equals two times the Width 1004, plus two times the spacing 1008. For the example widths and spacing given above, the repetition width 1006 equals sixteen, plus two, or eighteen mils (0.4572 mm).

Thus, compared to the wire bond pad arrangement 104 in accordance with the present invention, the prior art wire bond pad arrangement 1000 requires about 1.63 times as much space, using the example pad widths and pad spacing. The wire bond pad arrangement 104 minimizes the overall space required for the pads 912, thereby allowing the overall width of the wire bond pad arrangement 104 to be of a scale similar to the overall width of the plurality of contact pads 604 of the IC chip 302. The similar scale of the wire bond pad arrangement 104 and the plurality of contact pads 604 advantageously reduces the sweep of the wire bonds near the corners of the chip. In accordance with the present invention, the angle between the wire bond 602 and the edge of the IC chip 302 remains greater than the minimum angle considered acceptable, e.g., 45 degrees.

Figure 11:
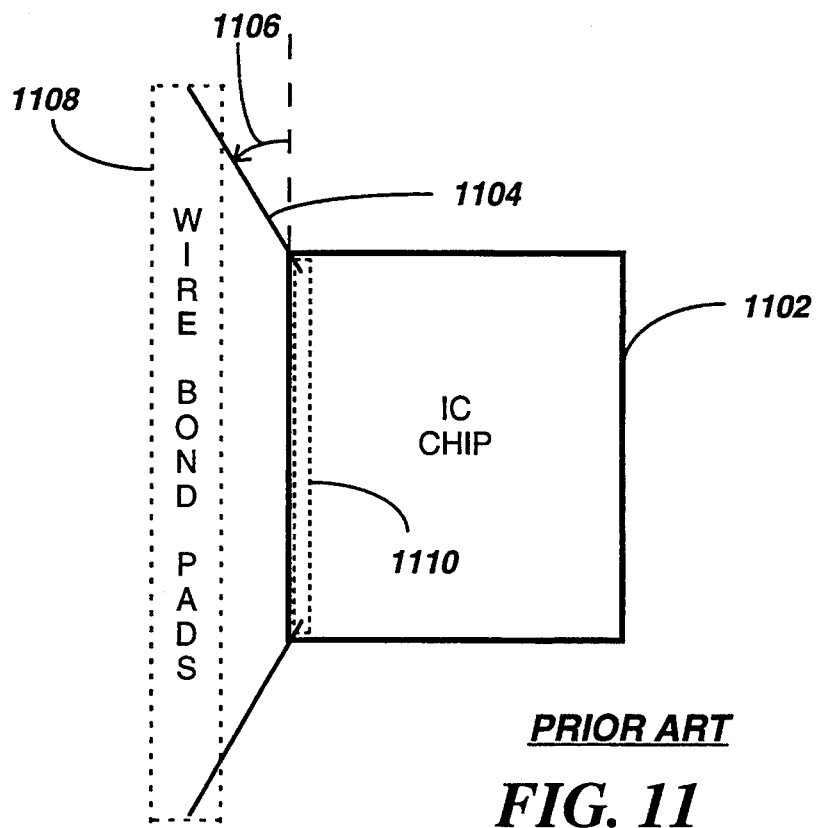
FIG. 11 is an orthogonal top view diagram depicting an overly wide sweep of the wire bonds near the corners of the IC chip of the prior art wire bond pad arrangement.

Referring to FIG. 11, an orthogonal top view diagram depicts an overly wide sweep of the wire bonds 1104 near the corners of the IC chip 1102 of the prior art wire bond pad arrangement 1000. Because the length of the area 1108 occupied by the prior art wire bond pad arrangement 1000 is substantially longer than the length of the area 1110 occupied by the termination pads along the edge of the IC chip 1102, the angle 1106 between the corner wire bonds 1104 and the edge of the IC chip 1102 is less than the minimum acceptable angle of forty-five degrees, thereby greatly increasing the probability of wire bond defects.

Figure 12:
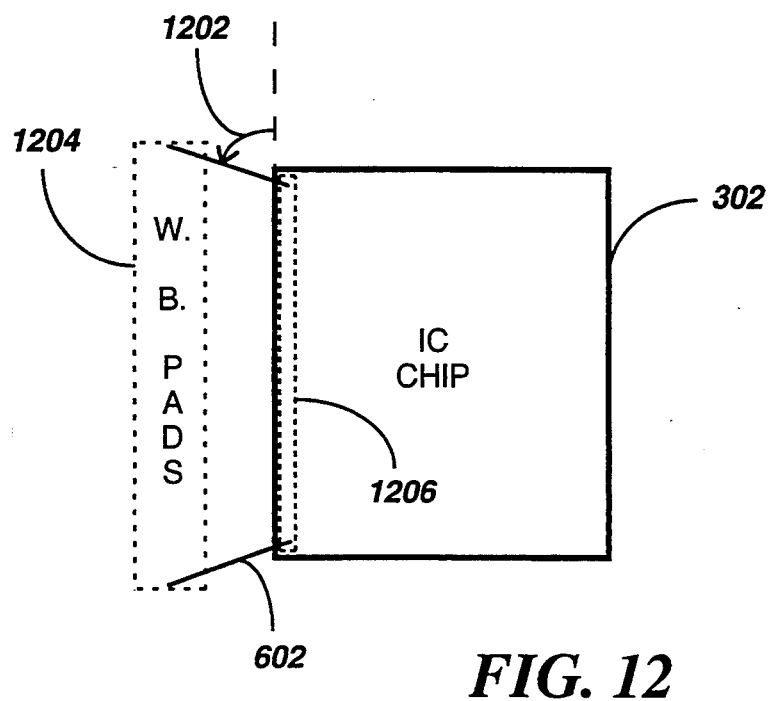
FIG. 12 an orthogonal top view diagram depicting an acceptable sweep of the wire bonds near the corners of the IC chip of the wire bond pad arrangement in accordance with the preferred embodiment of the present invention.

Referring to FIG. 12, an orthogonal top view diagram depicts an acceptable sweep of the wire bonds 602 near the corners out the IC chip 302 of the wire bond pad arrangement 104 in accordance with the preferred embodiment of the present invention. Because the length of the area 1204 occupied by the wire bond pad arrangement 104 is similar to the length of the area 1206 occupied by the termination pads 604 along the edge of the IC chip 302, the angle 1202 between the corner wire bonds 602 and the edge of the IC chip 302 is greater than the minimum acceptable angle of forty-five degrees, thereby advantageously reducing the probability of defects in the wire bonds.

The preferred embodiment in accordance with the present invention employs a dual-substrate design, comprising the flexible substrate 102 laminated to the rigid substrate 202 to minimize the size of the chip carrier 100. It will be appreciated, however, that the wire bond pad arrangement 104 in accordance with the present invention can be used as well with a chip carrier utilizing a single-substrate design, comprising either a rigid substrate or a flexible substrate. While the minimum allowable pad spacing will vary among types of substrates, the wire bond pad arrangement 104 will produce increased pad density, thereby advantageously reducing the wire bond sweep compared to that of the prior art wire bond pad arrangement 1000.

It will be further appreciated that the wire bond pad arrangement 104 in accordance with the present invention can be utilized in applications other than IC chip carriers. For example, the wire bond pad arrangement 104 can be utilized in a circuit carrying substrate to which one or more IC chips are attached and then wire bonded to form a circuit module or a functional printed circuit board. Other applications for the wire bond pad arrangement 104 will become apparent to one of ordinary skill in the art whenever there occurs a need to reduce wire bond sweep from an IC chip having a large number of inputs and outputs.

In summary, the present invention provides a pad arrangement that advantageously reduces wire bond sweep. The reduction in wire bond sweep is accomplished without violating the minimum pad width and pad separation requirements for acceptable wire bond manufacturing yields and pad isolation.

What is claimed is:

1. A wire bond pad arrangement having an improved pad density for providing a plurality of wire bond terminations for interconnection with corresponding terminations of an integrated circuit (IC) chip, the wire bond pad arrangement comprising:
   a substrate; and
   a plurality of pads disposed on the substrate adjacent to one another to form a row of pads, wherein each of the pads is formed in a trapezoidal shape having short and long sides parallel to one another and substantially perpendicular to a line from a central point of the pad to a central point of the corresponding termination of the IC chip, and wherein the long sides of adjacent pads are positioned alternately towards and away from the corresponding terminations of the IC chip, and wherein the plurality of pads are positioned such that the row of pads formed thereby is arcuate in shape.

2. The pad arrangement of claim 1, further comprising a plurality of runners disposed on the substrate and interconnecting with the plurality of pads, the plurality of runners having a minimum runner width, wherein the short side of the pad has a length substantially equal to the minimum runner width, and wherein the long side of the pad has a length determined by a minimum pad width required for reliable wire bonding thereto.

3. The pad arrangement of claim 2, wherein the short side of the pad and the long side of the pad are separated by approximately twice the length of the long side.

4. An integrated circuit (IC) chip carrier comprising:
   a wire bond pad arrangement having an improved pad density for providing a plurality of wire bond terminations for interconnection with corresponding terminations of an IC chip, the wire bond pad arrangement comprising:
      a substrate; and
      a plurality of pads disposed on the substrate adjacent to one another to form a row of pads, wherein each of the pads is formed in a trapezoidal shape having short and long sides parallel to one another and substantially perpendicular to a line from a central point of the pad to a central point of the corresponding termination of the IC chip, and wherein the long sides of adjacent pads are positioned alternately towards and away from the corresponding terminations of the IC chip, and wherein the plurality of pads are positioned such that the row of pads formed thereby is arcuate in shape,
   wherein the IC chip carrier further comprises a mounting pad array disposed on the bottom surface of the IC chip carrier and having an interconnection with said plurality of pads.

5. The IC chip carrier of claim 4, further comprising a plurality of runners disposed on the substrate and interconnecting with the plurality of pads, the plurality of runners having a minimum runner width, wherein the short side of the pad has a length substantially equal to the minimum runner width, and wherein the long side of the pad has a length determined by a minimum pad width required for reliable wire bonding thereto.

6. The IC chip carrier of claim 5, wherein the short side of the pad and the long side of the pad are separated by approximately twice the length of the long side.

7. A communication receiver comprising:
   an antenna for intercepting a signal including information;
   a receiver element coupled to the antenna for demodulating the signal to derive the information;
   a processor coupled to the receiver for processing the information;
   a support circuit coupled to the processor for providing miscellaneous support functions;
   a circuit bearing substrate coupled to the antenna, the receiver element, the processor, and the support circuit for interconnecting the same; and
   an integrated circuit (IC) chip carrier attached to at least one of the receiver element, the processor, and the support circuit for carrying and interconnecting the same, the IC chip carrier comprising:
      a wire bond pad arrangement having an improved pad density for providing a plurality of wire bond terminations for interconnection with corresponding terminations of the at least one of the receiver element, the processor, and the support circuit, the wire bond pad arrangement comprising:
         a substrate; and
         a plurality of pads disposed on the substrate adjacent to one another to form a row of pads, wherein each of the pads is formed in a trapezoidal shape having short and long sides parallel to one another and substantially perpendicular to a line from a central point of the pad to a central point of the corresponding termination of the at least one of the receiver element, the processor, and the support circuit, and wherein the long sides of adjacent pads are positioned alternately towards and away from the corresponding terminations of the at least one of the receiver element, the processor, and the support circuit, and wherein the plurality of pads are positioned such that the row of pads formed thereby is arcuate in shape,
      wherein the IC chip carrier further comprises a mounting pad array disposed on the bottom surface of the IC chip carrier and having an interconnection with said plurality of pads, the mounting pad array further coupled to the circuit bearing substrate for interconnecting therewith.

8. The communication receiver of claim 7, further comprising a plurality of runners disposed on the substrate and interconnecting with the plurality of pads, the plurality of runners having a minimum runner width, wherein the short side of the pad has a length substantially equal to the minimum runner width, and wherein the long side of the pad has a length determined by a minimum pad width required for reliable wire bonding thereto.

9. The communication receiver of claim 8, wherein the short side of the pad and the long side of the pad are separated by approximately twice the length of the long side.

* * * * *